(12) United States Patent
Spinali

(10) Patent No.: US 6,549,347 B1
(45) Date of Patent: Apr. 15, 2003

(54) CATADIOPTRIC LENS BARREL STRUCTURE

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,066

(22) Filed: Aug. 10, 2000

(51) Int. Cl.$^7$ ................................. G02B 7/02
(52) U.S. Cl. ....................... 359/819; 359/811
(58) Field of Search ................. 359/649, 716, 359/811, 819, 820, 821, 827, 822, 823, 695, 703, 704; 355/65, 53; 353/100, 101

(56) References Cited

U.S. PATENT DOCUMENTS

| | | | |
|---|---|---|---|
| 5,187,519 A | | 2/1993 | Takabayashi et al. .......... 355/53 |
| 5,593,752 A | * | 1/1997 | Pollatta et al. ............... 428/114 |
| 5,636,913 A | * | 6/1997 | Park ............................. 353/101 |
| 5,680,251 A | | 10/1997 | Kato et al. .................... 359/557 |
| 5,864,739 A | * | 1/1999 | Kaneko et al. ............... 399/220 |
| 6,195,213 B1 | * | 2/2001 | Omura et al. ................. 359/727 |
| 6,445,442 B2 | * | 9/2002 | Von Bunau et al. .......... 355/67 |
| 6,449,106 B1 | * | 9/2002 | Spinali ......................... 359/811 |
| 6,473,245 B1 | * | 10/2002 | Spinali ......................... 359/811 |
| 6,483,571 B1 | * | 11/2002 | Shiraishi ...................... 355/53 |

FOREIGN PATENT DOCUMENTS

WO   WO99/27570   6/1999

* cited by examiner

Primary Examiner—Georgia Epps
Assistant Examiner—Saeed Seyrafi
(74) Attorney, Agent, or Firm—Finnegan, Henderson, Farabow, Garrett & Dunner, LLP.

(57) ABSTRACT

A catadioptric lens barrel structure for a projection exposure apparatus includes first and second lens barrels. Each of the lens barrels has an optical axis. The optical axes run parallel to each other. The lens barrel structure also includes a third lens barrel transversely connecting the first lens barrel to the second lens barrel. A reticle is placed in front of an entrance end of the first lens barrels and a wafer is placed in front of an exit end of the second lens barrel. Each lens barrel has a center plane perpendicular to the corresponding optical axis at a position half-way along the length of the corresponding lens barrel. A lens barrel support structure firmly secures the plurality of lens barrels. The lens barrel support structure is made of a material having a low coefficient of thermal expansion. The support structure includes first and second support platforms to support the first and second lens barrels, respectively, near the corresponding center planes to minimize errors due to temperature changes, vibrational motion, or other external forces.

11 Claims, 4 Drawing Sheets

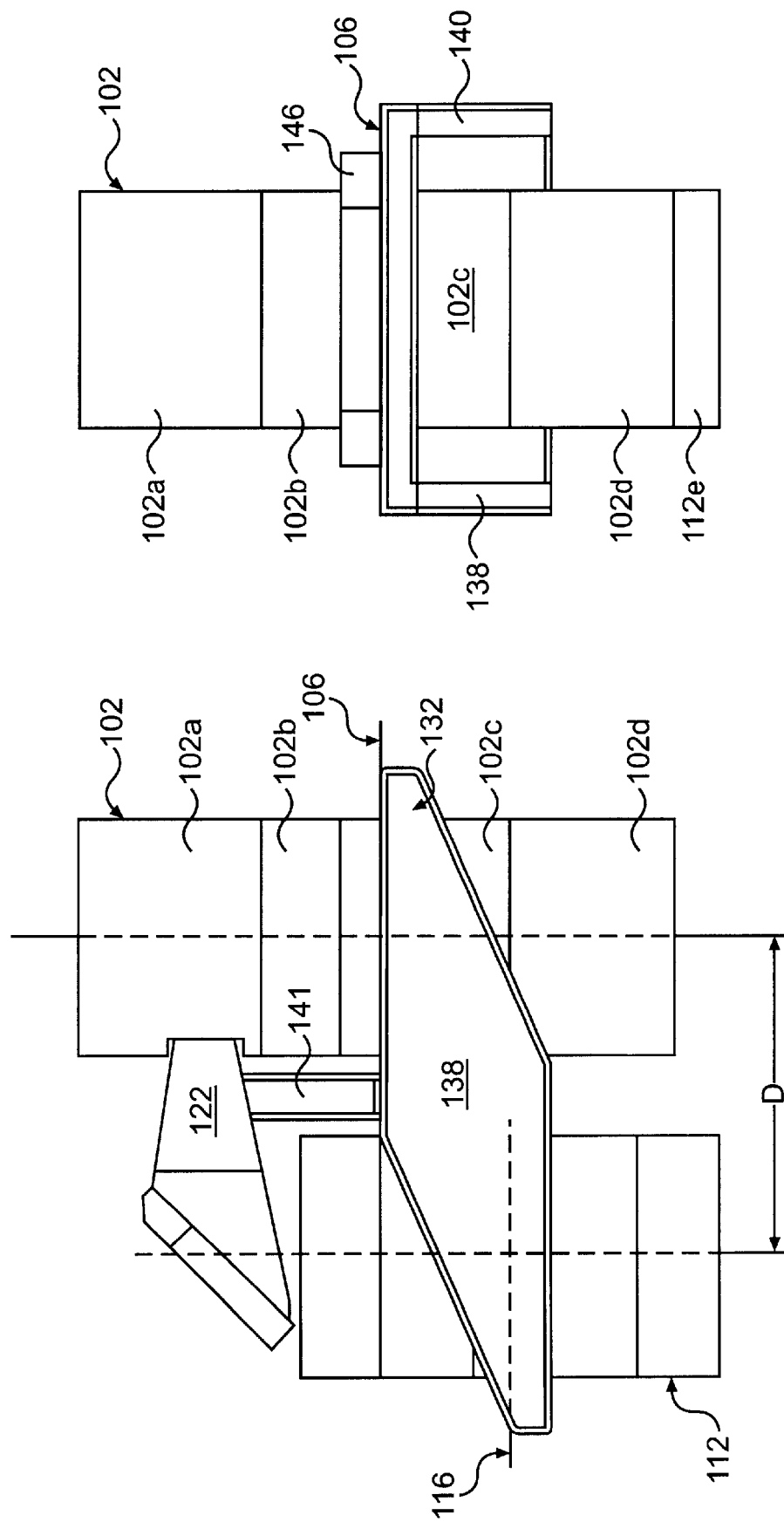

CATADIOPTRIC LENS BARREL STRUCTURE

BACKGROUND OF THE INVENTION

1. Field of the Invention

This invention relates to a catadioptric lens barrel which can be attached to an optical projection unit, such as a projection exposure apparatus used to manufacture semiconductor wafers. More particularly, the present invention relates to a catadioptric lens barrel structure including its support structure, the lens barrel structure comprising a plurality of lens barrels aligned in parallel, and at least one transverse lens barrel connecting the plurality of lens barrels.

2. Description of the Related Art

A lens barrel is a tubular mechanical structure containing a series of lenses which are aligned to transfer an image from one end of the lens barrel to the other. The lens barrel may include a sturdy threaded body and durable metal retaining rings, often referred to as "sub-barrels," to carry a series of lens holders, commonly referred to as "cells." One type of lens barrel is known as a catadioptric lens barrel. A catadioptric lens barrel contains not only refractive elements, such as lenses, but also reflective elements, such as mirrors.

Both of these lens barrel designs are used in conventional optical systems. For example, optical projection units often have a lens barrel and may be used in a projection exposure apparatus for production of semiconductor wafers. The projection exposure apparatus includes a reticle positioned near an entrance end of the lens barrel and a semiconductor wafer positioned near an exit end. The projection exposure apparatus shines light through the reticle, photographically reduces a pattern on the reticle, and sequentially transfers the pattern, through the lens barrel, onto a predetermined area on the semiconductor wafer. The semiconductor wafer is a silicon wafer with a photo-sensitive coating or layer for making semiconductor devices, such as microprocessor or memory chips.

A catadioptric lens barrel system using two or more lens barrels, arranged in parallel, offers benefits not found in conventional single barrel systems. The parallelism of the lens barrels reduces the overall height of the lens barrel, but increases the overall width. Reduced height is important for many reasons, such as for ease of transport. This type of catadioptric lens barrel design, however, poses several problems. First, keeping proper alignment of a plurality of lens barrels can be difficult. Second, the focus depth of the projection system changes as temperature changes. Coefficients of thermal expansion of the lens barrels, including their internal components, and the indices of refraction of all lens materials vary with temperature. Errors related to these factors collectively alter the focusing properties of the optical system. Third, the lens barrel structure tends to be more sensitive to movement or vibration than conventional single barrel designs.

In light of the foregoing, there is a need for a catadioptric lens barrel structure that holds the lens barrels stably and accurately, and minimizes distortion errors due to temperature changes, vibrational, or other external forces, so that the resulting image remains focused as it is transferred and reduced from the reticle to the wafer.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, one aspect of the invention is directed to a lens barrel structure for use in a projection exposure apparatus in semiconductor manufacturing to reduce a pattern on a reticle through the projection exposure apparatus to a semiconductor wafer. The lens barrel structure comprises a plurality of lens barrels and a support structure. Each lens barrel has a length, an optical axis, and a center plane. The center plane runs perpendicular to the corresponding optical axis at a position half-way along the length of the corresponding lens barrels. The support structure supports each lens barrel substantially near the center plane of the corresponding lens barrel, which provides enhanced stability.

A second aspect of the invention is directed to a method for making a lens barrel structure, which in one embodiment is used in projection exposure apparatus in a semiconductor manufacturing to reduce a pattern on a reticle through the projection exposure apparatus to a semiconductor wafer. The method comprises the step of disposing a plurality of lens barrels, each lens barrel having a length, an optical axis, and a center plane. The optical axis runs along the length of the lens barrel. The center plane runs perpendicular to the corresponding optical axis at a position half way along the length of the corresponding lens barrel. The method also comprises the step of providing a support structure for securing the plurality of lens barrels. The support structure secures each lens barrel substantially near the center plane of the corresponding lens barrel, which provides enhanced stability.

A third aspect of the invention is directed to a lithography system for use in a semiconductor manufacturing. The lithography system reduces a pattern on a reticle through a projection exposure apparatus to a semiconductor wafer. The lithography system comprises a lens barrel structure. The lens barrel structure comprises a plurality of lens barrels and a support structure. Each lens barrel has a length, an optical axis, and a center plane. The center plane runs perpendicular to the corresponding optical axis at a position half-way along the length of the corresponding lens barrels. The support structure supports each lens barrel substantially near the center plane of the corresponding lens barrel, which provides enhanced stability.

A fourth aspect of the invention is directed to a lens barrel structure made of particular materials, and maybe used in a projection exposure apparatus in semiconductor manufacturing to reduce a pattern on a reticle through the projection exposure apparatus to a semiconductor wafer. The lens barrel structure comprises a plurality of lens barrels and a support structure for supporting the plurality of lens barrels. The support structure is made of a material having a low coefficient of thermal expansion, such as 6 ppmt/° C. or below. The low coefficient of thermal expansion of the material reduces the effects of environmental changes on the lens barrel structure.

A fifth aspect of the invention is directed to a method for making a lens barrel structure made of particular materials, which may be used in a projection exposure apparatus in semiconductor manufacturing to reduce a pattern on a reticle through the projection exposure apparatus to a semiconductor wafer. The method comprises the steps of disposing a plurality of lens barrels, and providing a support structure for securing the plurality of lens barrels. The support structure is made of a material having a low coefficient of thermal expansion, such as 6 ppm/° C. or below. The low coefficient of thermal expansion of the material reduces the effects of environmental changes on the lens barrel structure.

A sixth aspect of the invention is directed to a lithography system for use in semiconductor manufacturing, the lithography system reducing a pattern on a reticle through a projection exposure apparatus to a semiconductor wafer. The lithography system comprises a lens barrel structure. The lens barrel structure comprises a plurality of lens barrels and a support structure for supporting the plurality of lens barrels. The support structure is made of a material having a low coefficient of thermal expansion, such as 6 ppm/° C. or below. The low coefficient of thermal expansion of the material reduces the effects of environmental changes on the lens barrel structure.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIG. 3 is a front view of the catadioptric lens barrel structure;

FIG. 4 is a side view of the catadioptric lens barrel structure; and

DESCRIPTION OF THE INVENTION

Reference will now be made in detail to an embodiment of the invention, examples of which are illustrated in the accompanying drawings. Wherever possible, the same reference numbers will be used throughout the drawings to refer to the same or like parts. The invention will be further clarified by the following examples, which are intended to be exemplary of the invention.

A catadioptric lens barrel structure is provided with a plurality of lens barrels and a support structure configured to provide enhanced stability and made out of materials that reduce the effects of environmental changes on the lens barrel structure. The lens barrels run parallel to each other. Each lens barrel has a center plane perpendicular to the length of the lens barrel and crossing the lens barrel at its mid-length. The support structure supports each of the lens barrel substantially near the corresponding center plane, which provides enhanced stability of the lens barrel structure. The support structure is made of a material having a low coefficient of thermal expansion, which reduces the effects of environmental changes on the lens barrel structure.

In accordance with the invention, a catadioptric lens barrel structure is provided with a plurality of lens barrels. Each lens barrel has an optical axis along the length of the lens barrel. The plurality of optical axes run parallel to each other. Each lens barrel also has a center plane defining a reference plane which is perpendicular to the corresponding optical axis at a position half-way along the length of the corresponding lens barrel.

Figure 1:
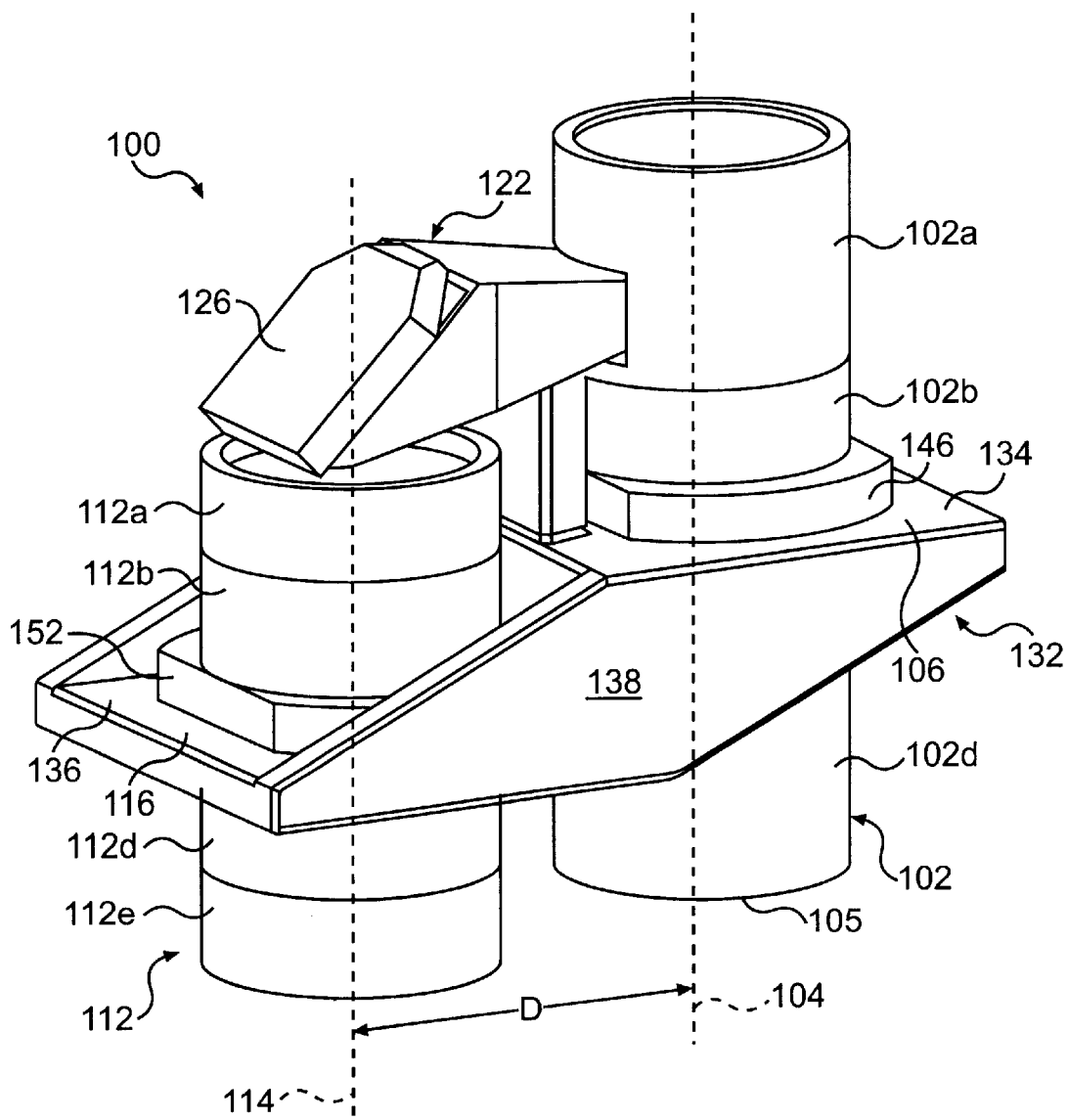
FIG. 1 is a perspective view of a catadioptric lens barrel structure consistent with the principles of the present invention.

In one embodiment, as illustrated in FIG. 1, a catadioptric lens barrel structure 100 comprises a pair of lens barrels including a first lens barrel 102 and a second lens barrel 112. First lens barrel 102 has a first optical axis 104 running along its length and a first center plane 106 defining a reference plane which is normal to first optical axis 104 at a position half-way along the length of the first lens barrel 102. Similarly, second lens barrel 112 has a second optical axis 114 running along its length and a second center plane 116 defining a reference plane which is normal to second optical axis 114 at a position half-way along the length of the second lens barrel 112. A reflective element 110, such as a mirror (discussed in greater detail below with respect to FIG. 2), is provided and positioned in front of an exit end 105 of first lens barrel 102. Mirror 110 preferably has an optical axis which is aligned with first optical axis 104.

First and second lens barrels 102 and 112 can be made of stainless steel or silicon carbide. For example, stainless steel commonly known in the industry as SS 17-7PH, SS 440 series, or SS 300 series may be used. First and second lens barrel 102 and 112 are quite large and heavy when used in a semi-conductor production. For example, first lens barrel 102 may be as large as one meter (approximately 40 inches) in length, slightly less than a half meter (approximately 16 inches) in diameter, and weighing almost 500 kilograms (approximately 1100 pounds).

First and second lens barrel 102 and 112 may be any of several different types of lens barrels. A traditional lens barrel, for example, is a type of lens barrel where the barrel carries a plurality of lens holders (commercially known as "cells"), on which lenses are mounted. The plurality of lens holders are stacked in a serial orientation along the optical axis of the lens barrel. Another type of lens barrel comprises a series of sub-barrels connected end to end by fasteners. FIGS. 1, 3, 4, and 5 show first and second lens barrels 102 and 112 as the sub-barrel type, first lens barrel 102 comprising sub-barrels 102a, 102b, 102c, and 102d, and second lens barrel 112 comprising sub-barrels 112a, 112b, 112c, 112d, and 112e.

Further, in accordance with the invention, a catadioptric lens barrel structure is provided with at least one transverse lens barrel connecting one lens barrel to the next successive lens barrel. Each transverse lens barrel comprises a pair of reflective elements. The reflective elements are angularly oriented. The reflective elements reflect an image of the reticle as the image is reflected off the reflective element in front of the exit end of the first lens barrel to the second lens barrel and onto a wafer in front of an exit end of the second lens barrel.

As shown in FIG. 1, catadioptric lens barrel structure 100 comprises a transverse lens barrel 122 connecting first lens barrel 102 to second lens barrel 112. Transverse lens barrel 122 carries therein a pair of mirrors 124 and 126. Mirror 124 is located inside first lens barrel 102 and not shown in FIG.

1. Mirrors 124 and 126 have angular orientations. Transverse lens barrel 122 is preferably made of a material having a low coefficient of thermal expansion. For example, as low as 6 ppm/° C. or below. Some materials having this property include alumina ceramic ($Al_2O_3$), Invar, Ultra Low Expansion™ (ULE) glass, Zerodur glass, and silicon carbide (SiC). The reason for selecting this material will be explained below.

Also, consistent with the principles of the invention, a catadioptric lens barrel structure is provided with a support structure 132. The support structure 132 is preferably made of a material having a low coefficient of thermal expansion. For example, the coefficient of thermal expansion may be as low as 6 ppm/° C. or below. Similar to the materials for transverse lens barrel 122, selection of materials having this property includes alumina ceramic ($Al_2O_3$), Invar, ULE™ glass, Zerodur glass, and silicon carbide (SiC). Table 1 below shows some examples of materials having this property.

TABLE 1

| Materials | Coefficients of Thermal Expansion |
|---|---|
| Alumina Ceramic ($Al_2O_3$) | 5.7 ppm/° C. |
| Invar | 0.64–3.11 ppm/° C. (depending on heat treatment) |
| ULE ™ | 0.03 ppm/° C. |
| Zerodur | 0.05 ppm/° C. |
| Silicon Carbide (SiC) | 0.4–5.1 ppm/° C. (depending on temperature range) |

Further, consistent with the principles of the invention, the support structure preferably includes a first support platform and a second support platform. The first and second support platforms run parallel to each other. Each support platform corresponds with and runs perpendicular to each corresponding optical axis. Each support platform has an opening to accommodate the corresponding lens barrel. The first support platform firmly secures the first lens barrel at the mid-length of the first lens barrel substantially aligned with the first center plane. Similarly, the second support platform firmly secures the second lens barrel at the mid-length of the second lens barrel substantially aligned with the second center plane. The support structure further includes a set of support panels to support the first and second support platforms. The support structure may further include a support stand to support the transverse lens barrel.

The barrel support structure 132 includes a first support platform 134, a second support platform 136, and a set of support panels 138, 140 (best shown in FIG. 4). First and second support platforms 134, 136, and support panels 138, 140, may be constructed of individual parts fastened together by high strength fasteners or adhesive, or may be an integral structure machined to form support structure 132. Support structure 132 may further include a support stand 141 attached to support structure 132, preferably to first support platform 136, to support transverse lens barrel 122. Support stand 141 may be an integral part of first support platform 136, or a separate part securely fastened to the first support platform 136 and transverse lens barrel 122.

Figure 2:
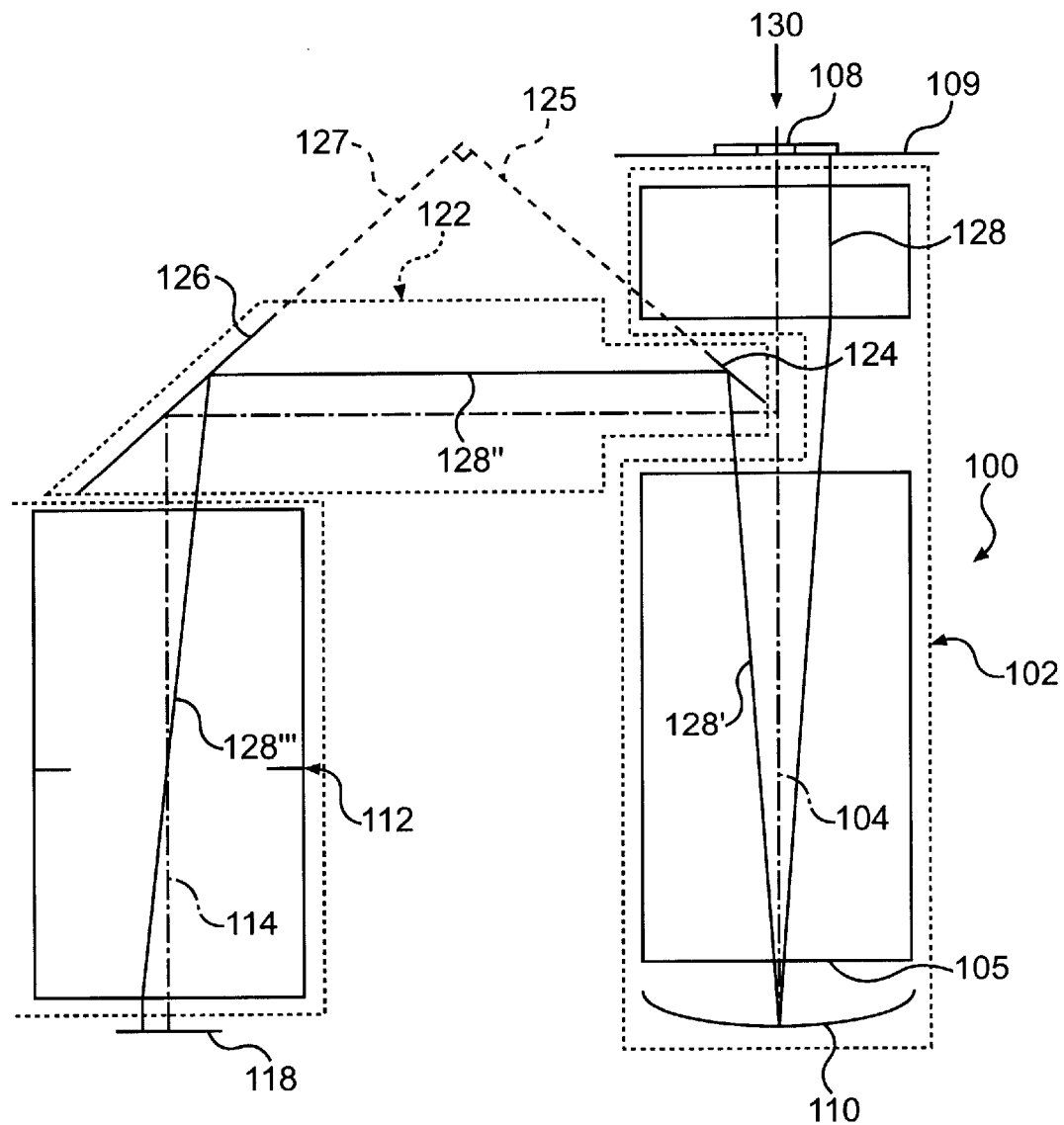
FIG. 2 is a schematic diagram of the catadioptric lens barrel structure according to one embodiment consistent with the principles of the invention, illustrated with light path passing through the lens barrel structure.

FIG. 2 illustrates the path of a light path 128 through lens barrel structure 100 as discussed with respect to FIG. 1. Light source 130 illuminates reticle 108 to create light path 128, which enters first lens barrel 102. Reticle 108 is located on image plane 109. Light path 128 is reflected off of mirror 110, as light path 128', and travels back through first lens barrel 102. Light path 128' then hits mirror 124 carried inside transverse lens barrel 122, is reflected off of mirror 124, as light path 128''', and is reflected off of mirror 126, as light path 128''. Light path 128''' travels through second lens barrel 112 and hits wafer 118. Mirrors 124 and 126 are preferably oriented at 45° angle from light paths 128' and 128'', respectively. Therefore, in this embodiment if imaginary extension lines 125 and 127 are drawn from mirrors 124 and 126, respectively, it will be shown that mirrors 124 and 126 are perpendicular to each other.

The purpose of using low expansion materials for lens barrel support structure 132 and transverse lens barrel 122 is to minimize errors related to distortion, such as expansion or contraction, of the catadioptric lens barrel structure 100 due to environmental changes such as temperature changes. Therefore, first and second support platforms 134, 136, along with transverse lens barrel 122 substantially maintain the distance D between first and second optical axes 104, 114, respectively, regardless of temperature changes or gradient.

Distance D is a key parameter of catadioptric lens barrel structures consistent with the invention. First and second support platforms 134, 136 may be made of the same material selected from Table 1 so that support platforms 134, 136 will expand or contract, if at all, at the same rate, and subsequently, keep the distance D substantially constant and maintain first and second lens barrels 102, 112 substantially parallel. Transverse lens barrel 122 is also made of a material selected from Table 1, and preferably, although not necessarily, of the same material as first and second support platforms 134, 136. If transverse lens barrel 122 is made of a different material than the first or second support platforms 134, 136, then some kind of adjustment mechanism will be needed. Such adjustment mechanism may include a set of flexures located inside transverse lens barrel 122.

The purpose of support structure 132, consistent with the principles of the invention, is to minimize errors related to distortion, such as expansion or contraction, of the catadioptric lens barrel structure 100 due to environmental changes such as changes in temperature. Conventional lens barrel support structures provide a base mounting support to the plurality of lens barrels. When temperature changes, either increases or decreases, the lens barrels will expand or contract accordingly. The change in length of the lens barrel ($\Delta L$) can be mathematically determined according to this expression:

$$\Delta L = \alpha \cdot L \cdot \Delta T$$

whereby $\alpha$ is the coefficient of thermal expansion of the material of the lens barrel; L is the initial length of the lens barrel; and $\Delta T$ is the temperature difference or final temperature subtracted from initial temperature. Thus, in a base mounting support structure, a lens barrel having a length L will experience a change in length by $\Delta L$. This change in length will affect the alignment of the transverse lens barrel, as well as the plurality of lenses and mirrors inside the lens barrels, and subsequently will cause a substantial error when the wafer finally receives the image from the reticle. In a center mounting support structure according to this invention whereby a lens barrel having the same overall length L is supported by a support structure mounted at the lens barrel mid-length, each of the upper and lower halves of the lens barrel will experience a change in length by one half of the overall change in length (½ $\Delta L$) as measured from the center mounting support structure. In addition, center mounting support structure also allows maximum strength in holding of the lens barrels and reducing vibrational motion of the lens barrel structure.

Figure 5:
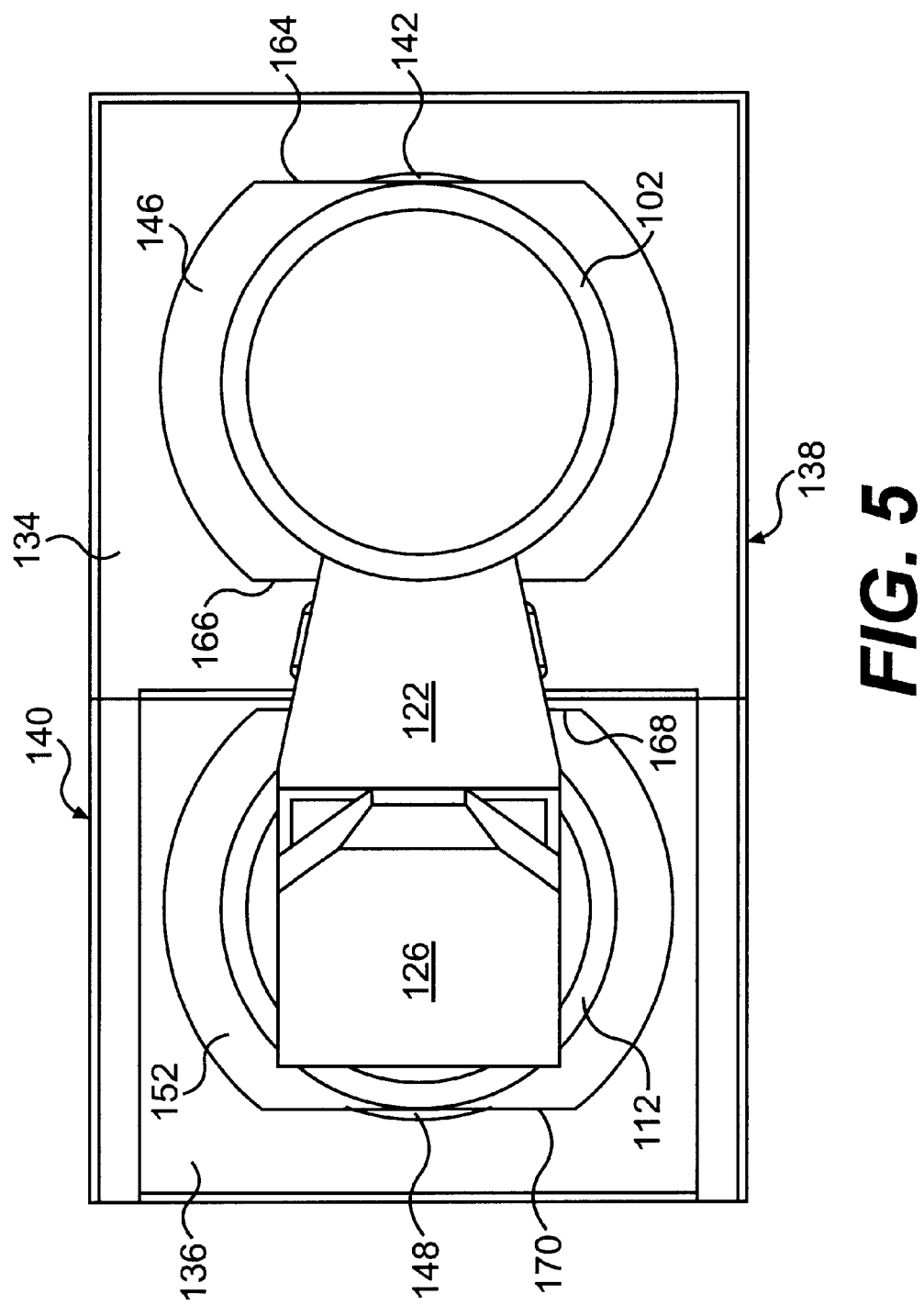
FIG. 5 is a top view of the catadioptric lens barrel structure.

FIGS. 3, 4, and 5 show front, side and top views, respectively, of the catadoptric lens barrel structure. First support platform 134 has an opening 142 to accommodate first lens barrel 102. Opening 142 is slightly larger in diameter to provide clearance, allowing first lens barrel 102 to expand and contract. A first flange 146 is provided around opening 142 to firmly secure first lens barrel 102 to first support platform 134. Similarly, second support platform 136 has an opening 148 to accommodate second lens barrel 112. Opening 148 is slightly larger in diameter to provide clearance, allowing second lens barrel 112 to expand and contract. A second flange 152 is provided around opening 148 to firmly secure second lens barrel 112 to second support platform 136. Flanges 146, 152 have a circular shape and may have segment cuts on two opposing edges 164 166, 168, and 170. The segment cuts facilitate a more compact structural design by positioning first and second lens barrels 102, 112 closer together. First and second flanges 146, 152 may be fastened to first and second platforms 134, 136, respectively, by a series of bolts or other type of fasteners.

It will be apparent to those skilled in the art that various modifications and variations can be made in the catadioptric lens barrel structure, the material chosen for the present invention, and in construction of the number of lens barrels arrangement and the support structure as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. A lens barrel structure, comprising:

a plurality of lens barrels, each lens barrel having a length, an optical axis, and a center plane perpendicular to the corresponding optical axis at a position half-way along the length of the corresponding lens barrels;

at least one transverse lens barrel between one lens barrel and a next successive lens barrel; and a support structure for supporting each lens barrel substantially near the center plane of the corresponding lens barrel, wherein the support structure is made of a material having a coefficient of thermal expansion of 6 ppm/° C. or below and the material includes at least one of alumina ceramic, Ultra Low Expansion™ glass, Zerodur glass, silicon carbide, and Invar.

2. The lens barrel structure of claim 1, wherein the support structure comprises:

a first structure for supporting a first lens barrel; and a second structure for supporting a second lens barrel;

wherein the optical axes of the first and second lens barrels are substantially parallel to each other, the distance separating one optical axis to the next successive optical axis remains substantially constant, and the distance separating one center plane to the next successive center plane remains substantially constant.

3. The lens barrel structure of claim 1, wherein the at least one transverse lens barrel further comprises a pair of reflective elements for reflecting an image from the one lens barrel to the next successive lens barrel.

4. The lens barrel structure of claim 3, wherein the at least one transverse lens barrel is made of a material having a coefficient of thermal expansion of 6 ppm/° C. or below.

5. A lens barrel structure, comprising:

a plurality of lens barrels;

a support structure for supporting the plurality of lens barrels, the support structure being made of a material having a coefficient of thermal expansion of 6 ppm/° C. or below; and at least one transverse lens barrel between one lens barrel and a next successive lens barrel.

6. The lens barrel structure of claim 5, wherein the material includes at least one of alumina ceramic, Ultra Low Expansion™ glass, Zerodur glass, silicon carbide, and Invar.

7. The lens barrel structure of claim 5, wherein each lens barrel further comprises: a length, an optical axis along the length of the lens barrel, and a center plane perpendicular to the corresponding optical axis at a position half-way along the length of the corresponding lens barrel.

8. The lens barrel structure of claim 7, wherein the support structure secures each lens barrel substantially near the center plane of the corresponding lens barrel.

9. The lens barrel structure of claim 8, wherein the support structure, comprises:

a first structure for supporting a first lens barrel; and a second structure for supporting a second lens barrel;

wherein the optical axes of the first and second lens barrels are substantially parallel to each other, the distance separating one optical axis to the next successive optical axis remains substantially constant, and the distance separating one center plane to the next successive center plane remains substantially constant.

10. The lens barrel structure of claim 5, wherein the lens barrel structure further comprises at least one reflective element corresponding to the plurality of lens barrels minus one, each reflective element positioned in front of an exit end of the corresponding lens barrel.

11. The lens barrel structure of claim 10, wherein the at least one transverse lens barrel is made of a material having a coefficient of thermal expansion of 6 ppm/° C. or below.

* * * * *